United States Patent [19]
Yu et al.

[11] Patent Number: 6,004,883
[45] Date of Patent: Dec. 21, 1999

[54] DUAL DAMASCENE PATTERNED CONDUCTOR LAYER FORMATION METHOD WITHOUT ETCH STOP LAYER

[75] Inventors: Chen-Hua Douglas Yu; Syun Ming Jang, both of Hsin-Chu, Taiwan

[73] Assignee: Taiwan Semiconductor Manufacturing Company, Ltd., Hsin-Chu, Taiwan

[21] Appl. No.: 09/177,186

[22] Filed: Oct. 23, 1998

[51] Int. Cl.$^6$ .................................................. H01L 21/30
[52] U.S. Cl. .......................... 438/706; 438/711; 438/723
[58] Field of Search .................................. 438/706, 711, 438/712, 714, 717, 723, 700, 221, 740

[56] References Cited

U.S. PATENT DOCUMENTS

| | | | |
|---|---|---|---|
| 5,380,546 | 1/1995 | Krishnan et al. | 427/126.1 |
| 5,466,639 | 11/1995 | Ireland | 437/195 |
| 5,565,384 | 10/1996 | Havemann | 437/228 |
| 5,635,423 | 6/1997 | Huang et al. | 437/195 |
| 5,686,354 | 11/1997 | Avanzino et al. | 437/190 |
| 5,705,430 | 1/1998 | Avanzino et al. | 437/195 |
| 5,817,572 | 10/1998 | Chiang et al. | 438/624 |

OTHER PUBLICATIONS

Korczynski, "Low–K Dielectric Integration Costmodelling" Solid State Technology, Oct. 1997, p. 123–28.

*Primary Examiner*—Benjamin Utech
*Assistant Examiner*—Kin-Chan Chen
*Attorney, Agent, or Firm*—George O. Saile; Stephen B. Ackerman; Alek P. Szecsy

[57] ABSTRACT

A method for forming a via through a dielectric layer within a microelectronics fabrication. There is first provided a substrate employed within a microelectronics fabrication. There is then formed upon the substrate a patterned first dielectric layer which defines a via accessing a contact region formed within the substrate. The patterned first dielectric layer is formed of a first dielectric material which is not susceptible to etching with an oxygen containing plasma. There is then formed upon the patterned first dielectric layer a blanket second dielectric layer which completely covers the patterned first dielectric layer and fills the via. The blanket second dielectric layer is formed of a second dielectric material which is susceptible to etching within the oxygen containing plasma. There is then formed upon the blanket second dielectric layer a blanket hard mask layer which is formed from a hard mask material which is not susceptible to etching within the oxygen containing plasma. There is then formed upon the blanket hard mask layer a patterned photoresist layer which leaves exposed a portion of the blanket hard mask layer greater that an areal dimension of the via and at least partially overlapping the areal dimension of the via. There is then etched while employing a first plasma etch method the blanket hard mask layer to form a patterned hard mask layer defining a first trench formed through the patterned hard mask layer while employing the patterned photoresist layer as a first etch mask layer. The first plasma etch method employs a first etchant gas composition appropriate to the hard mask material from which is formed the blanket hard mask layer. Finally, there is then etched while employing a second plasma etch method the blanket second dielectric layer to form a patterned second dielectric layer having an aperture formed therethrough. The aperture comprises: (1) a second trench corresponding with the first trench; and (2) at least a portion of the first via. The second plasma etch method employs the oxygen containing plasma.

13 Claims, 4 Drawing Sheets

DUAL DAMASCENE PATTERNED CONDUCTOR LAYER FORMATION METHOD WITHOUT ETCH STOP LAYER

CROSS-REFERENCE TO RELATED APPLICATION

This application is related to a co-assigned and co-invented application Ser. No. 09/177,187 attorney docket number TSMC 97-353, filed Oct. 23, 1998, and similarly titled "Dual Damascene Patterned Conductor Layer Formation Method Without Etch Stop Layer," the teachings of which are incorporated herein by reference.

BACKGROUND OF THE INVENTION

1. Field of the Invention

The present invention relates generally to methods for forming patterned conductor layers separated by patterned dielectric layers within microelectronics fabrications. More particularly, the present invention relates to dual damascene methods for forming patterned conductor layers separated by patterned dielectric layers within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and microelectronics device and patterned conductor layer dimensions have decreased, it has become increasingly common within the art of microelectronics fabrication to employ, interposed between the patterns of narrow linewidth dimension and/or narrow pitch dimension patterned microelectronics, conductor layers within microelectronics fabrications microelectronics dielectric layers formed of low dielectric constant dielectric materials. Such patterned microelectronics conductor layers often access within the microelectronics fabrications within which they are formed patterned conductor contact stud layers or patterned conductor interconnection stud layers. For the purposes of the present disclosure, low dielectric constant dielectric materials are intended as dielectric materials having a dielectric constant of less than about 3.0. For comparison purposes, dielectric layers formed employing conventional silicon oxide dielectric materials, silicon nitride dielectric materials or silicon oxynitride dielectric materials typically have dielectric constants in the range of from about 4.0 to about 7.0.

Microelectronics dielectric layers formed of low dielectric constant dielectric materials are desirable interposed between the patterns of narrow linewidth dimension and/or narrow pitch dimension patterned microelectronics conductor layers within microelectronics fabrications since such dielectric layers formed from such low dielectric constant dielectric materials provide dielectric layers which assist in providing microelectronics fabrications exhibiting enhanced microelectronics fabrication speed, attenuated patterned microelectronics conductor layer parasitic capacitance, and attenuated patterned microelectronics conductor layer crosstalk.

Low dielectric constant dielectric materials which may be employed for forming low dielectric constant microelectronics dielectric layers within microelectronics fabrications are typically materials with hydrogen and/or carbon content, such as but not limited to organic polymer spin-on-polymer dielectric materials (such as but not limited to polyimide organic polymer spin-on-polymer dielectric materials, poly-arylene-ether organic polymer spin-on-polymer dielectric materials, and fluorinated poly-arylene-ether organic polymer spin-on-polymer dielectric materials), amorphous carbon dielectric materials (such as but not limited to amorphous carbon and fluorinated amorphous carbon), and silsesqiuoxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials, and carbon bonded fluorocarbon silsesquioxane spin-on-glass (SOG) dielectric materials).

While organic polymer spin-on-polymer dielectric materials, amorphous carbon dielectric materials, and silsesquioxane spin-on-glass (SOG) dielectric materials are thus desirable within the art of microelectronics fabrication for forming patterned low dielectric constant microelectronics dielectric layers interposed between the patterns of patterned conductor layers which access patterned conductor stud layers within microelectronics fabrications, such microelectronics fabrication structures are often not formed entirely without problems. In particular, such microelectronics fabrication structures are typically formed employing an etch stop layer formed interposed between: (1) a patterned first dielectric layer through which is formed a patterned conductor stud layer; and (2) a patterned low dielectric constant dielectric layer which is formed adjoining the patterned conductor layer which contacts the patterned conductor stud layer. The etch stop layer typically assures optimal definition of the patterned conductor layer within respect to the patterned conductor stud layer. Unfortunately, the presence of such etch stop layers often provides additional microelectronics fabrication complexity within microelectronics fabrications within which are formed patterned conductor layers which contact patterned conductor stud layers.

It is thus towards the goal of forming microelectronics fabrication structures comprising patterned low dielectric constant dielectric layers separating patterned conductor layers which in turn contact patterned conductor stud layers, with attenuated microelectronics fabrication complexity, that the present invention is directed.

Various methods have been disclosed in the art of microelectronics fabrication for forming patterned microelectronics layers within microelectronics fabrications.

For example, Korczynski, in "Low-k dielectric integration cost modelling," Solid State Technology, Oct. 1997, pp. 123–28, discloses in general various methods and materials for forming patterned low dielectric constant dielectric layers interposed between the patterns of patterned conductor layers which in turn contact patterned conductor stud layers within microelectronics fabrications. Disclosed are standard patterned conductor layer formation and dielectric layer isolation methods and dual damascene patterned conductor layer formation and dielectric layer isolation methods.

In addition, Krishnan et al., in U.S. Pat. No. 5,380,546, discloses a maskiess method for forming a barrier layer surrounded metal feature within a planar insulator layer within a microelectronics fabrication. The barrier layer surrounded metal feature so formed is formed employing a planarizing method rather than a masking method.

Further, Ireland, in U.S. Pat. No. 5,466,639, discloses a dual damascene method for forming a patterned conductor layer contiguous with a patterned conductor stud layer within a semiconductor integrated circuit microelectronics fabrication. The dual damascene method employs a patterned mask layer formed interposed between a lower dielectric layer through which is formed the patterned conductor stud layer and an upper dielectric layer through which is formed the patterned conductor layer contiguous with the patterned conductor stud layer, where the upper dielectric layer and the lower dielectric layer are patterned employing a single reactive ion etch method.

Yet further, Havemann, in U.S. Pat. No. 5,565,384, discloses a method for forming within an integrated circuit microelectronics fabrication a self-aligned via through an inorganic dielectric layer to access a patterned conductor layer formed below the inorganic dielectric layer, where the patterned conductor layer has interposed at least partially between its patterns an organic containing dielectric layer. The patterned conductor layer and the organic dielectric layer are completely covered by the inorganic dielectric layer. The method employs an anisotropic etchant which is selective to the inorganic dielectric layer with respect to the organic dielectric layer, such that the organic dielectric layer serves as an etch stop layer when etching the self-aligned via through the inorganic dielectric layer, thus avoiding overetching of the organic dielectric layer.

Still yet further, Huang et al., in U.S. Pat. No. 5,635,423 also discloses a dual damascene method for forming a patterned conductor layer contiguous with a patterned conductor stud layer within a semiconductor integrated circuit microelectronics fabrication. The dual damascene method employs a blanket mask layer formed interposed between a lower dielectric layer through which is formed the patterned conductor stud layer and an upper dielectric layer through which is formed the patterned conductor layer contiguous with the patterned conductor stud layer, where the upper dielectric layer and the lower dielectric layer are sequentially patterned employing separate reactive ion etch (RIE) methods.

Finally, Avanzino et al., in U.S. Pat. No. 5,686,354, discloses yet another dual damascene method for forming a patterned conductor layer contiguous with a patterned conductor stud layer within a microelectronics fabrication. The dual damascene method employs a single dielectric layer sequentially: (1) partially patterned employing a first etch method to form a trench within the single dielectric layer; and (2) subsequently completely patterned employing a second etch method and hard mask layer exposing a portion of a floor within the trench, to define with sharp sidewall edges the patterned conductor stud layer through the single dielectric layer.

Desirable in the art of microelectronics fabrication are methods through which there may be formed within microelectronics fabrications low dielectric constant dielectric layers interposed between the patterns of patterned conductor layers which in turn contact patterned conductor stud layers, with attenuated process complexity.

It is towards the foregoing object that the present invention is both generally and more specifically directed.

SUMMARY OF THE INVENTION

A first object of the present invention is to provide a method for forming within a microelectronics fabrication a patterned low dielectric constant dielectric layer adjoining a patterned conductor layer which in turn contacts a patterned conductor stud layer.

A second object of the present invention is to provide a method in accord with the first object of the present invention, where the method provides for attenuated process complexity.

A third object of the present invention is to provide a method in accord with the first object of the present invention or the second object of the present invention, where the microelectronics fabrication is a semiconductor integrated circuit microelectronics fabrication.

A fourth object of the present invention is to provide a method in accord with the first object of the present invention, the second object of the present invention or the third object of the present invention, which method is readily commercially implemented.

In accord with the objects of the present invention, there is provided by the present invention a method for forming a via through a dielectric layer within a microelectronics fabrication. To practice the method of the present invention, there is first provided a substrate employed within a microelectronics fabrication, where the substrate has a contact region formed therein. There is then formed upon the substrate a patterned first dielectric layer, where the patterned first dielectric layer defines a via accessing the contact region. The patterned first dielectric layer is formed from a first dielectric material which is not susceptible to etching within an oxygen containing plasma. There is then formed upon the patterned first dielectric layer a blanket second dielectric layer, where the blanket second dielectric layer completely covers the patterned first dielectric layer and fills the via. The blanket second dielectric layer is formed from a second dielectric material which is susceptible to etching within the oxygen containing plasma. There is then formed upon the blanket second dielectric layer a blanket hard mask layer, where the blanket hard mask layer is formed from a hard mask material which is not susceptible to etching within the oxygen containing plasma. There is then formed upon the blanket hard mask layer a patterned photoresist layer, where the patterned photoresist layer leaves exposed a portion of the blanket hard mask layer greater that an areal dimension of the via and at least partially overlapping the areal dimension of the via. There is then etched while employing a first plasma etch method the blanket hard mask layer to form a patterned hard mask layer defining a first trench formed through the patterned hard mask layer while employing the patterned photoresist layer as a first etch mask layer. The first plasma etch method employs a first etchant gas composition appropriate to the hard mask material from which is formed the blanket hard mask layer. Finally, there is then etched while employing a second plasma etch method the blanket second dielectric layer to form a patterned second dielectric layer defining an aperture formed therethrough. The aperture comprises: (1) a second trench corresponding with the first trench; and (2) at least a portion of the first via. The second plasma etch method employs the oxygen containing plasma. There may subsequently be formed within the aperture a patterned conductor layer within the second trench contiguous with a conductor stud layer within the via while employing a damascene method.

The present invention provides a method for forming within a microelectronics fabrication a patterned low dielectric constant dielectric layer adjoining a patterned conductor layer which in turn contacts a patterned conductor stud layer, where the method provides for attenuated process complexity. The method of the present invention realizes the foregoing objects by employing when forming the patterned low dielectric constant dielectric layer a low dielectric constant dielectric material which is etchable within an oxygen containing plasma. The patterned low dielectric constant dielectric layer so formed is formed upon a patterned first dielectric layer which is not etchable within the oxygen containing plasma, where the patterned first dielectric layer defines a via accessing a contact region within a substrate layer formed beneath the patterned first dielectric layer. Thus, when employing an appropriate hard mask layer and an oxygen containing plasma etch method employing the oxygen containing plasma, there may be formed without employing an etch stop layer interposed between the patterned first dielectric layer and the low dielectric constant dielectric layer an aperture through the low dielectric constant dielectric layer and the patterned first dielectric layer, which aperture comprises: (1) a trench within the low dielectric constant dielectric layer; and (2) at least a portion of the via. The aperture so formed may subsequently have formed therein a patterned conductor layer contiguous with a patterned conductor stud layer while employing a damascene method. Thus, the present invention provides a method for forming within a microelectronics fabrication a patterned low dielectric constant dielectric layer adjoining a patterned conductor layer which in turn contacts and is contiguous with a patterned conductor stud layer, where the method provides for attenuated process complexity.

The present invention may be employed where the microelectronics fabrication is a semiconductor integrated circuit microelectronics fabrication. The present invention does not discriminate with respect to the nature of a microelectronics fabrication within which is formed a patterned low dielectric constant dielectric layer interposed between the patterns of a patterned conductor layer which in turn contacts a patterned conductor stud layer. Thus, although the method of the present invention may be employed when forming patterned low dielectric constant dielectric layers interposed between the patterns of patterned conductor layers which in turn contact patterned conductor stud layers within semiconductor integrated circuit microelectronics fabrications, the method of the present invention may also be employed in forming patterned low dielectric constant dielectric layers interposed between the patterns of patterned conductor layers which in turn contact patterned conductor stud layers within microelectronics fabrications including but not limited to semiconductor integrated circuit microelectronics fabrications, solar cell microelectronics fabrications, ceramic substrate microelectronics fabrications and flat panel display microelectronics fabrications.

The present invention is readily commercially implemented. The method of the present invention employs methods and materials which are otherwise generally known in the art of microelectronics fabrication. Since it is a novel ordering and use of methods and materials which provides the method of the present invention, rather than the existence of the methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for forming within a microelectronics fabrication a patterned low dielectric constant dielectric layer adjoining a patterned conductor layer which in turn contacts a patterned conductor stud layer, where the method provides for attenuated process complexity. The method of the present invention realizes the foregoing objects by employing when forming the patterned low dielectric constant dielectric layer a low dielectric constant dielectric material which is etchable within an oxygen containing plasma. The patterned low dielectric constant dielectric layer so formed is formed upon a patterned first dielectric layer which is not etchable within the oxygen containing plasma, where the patterned first dielectric layer defines a via accessing a contact region within a substrate layer formed beneath the patterned first dielectric layer. Thus, when employing an appropriate hard mask layer and an oxygen containing plasma etch method employing the oxygen containing plasma, there may be formed without employing an etch stop layer interposed between the patterned first dielectric layer and the low dielectric constant dielectric layer an aperture through the low dielectric constant dielectric layer and the patterned first dielectric layer, where the aperture comprises: (1) a trench within the low dielectric constant dielectric layer; and (2) at least a portion of the via. The aperture so formed may subsequently have formed therein a patterned conductor layer contiguous with a patterned conductor stud layer while employing a damascene method.

The present invention does not discriminate with respect to the nature of a microelectronics fabrication within which is formed a patterned low dielectric constant dielectric layer interposed between the patterns of a patterned conductor layer which in turn contacts a patterned conductor stud layer. Thus, although the method of the present invention may be employed when forming patterned low dielectric constant dielectric layers interposed between the patterns of patterned conductor layers which in turn contact patterned conductor stud layers within semiconductor integrated circuit microelectronics fabrications, the method of the present invention may also be employed in forming patterned low dielectric constant dielectric layers interposed between the patterns of patterned conductor layers which in turn contact patterned conductor stud layers within microelectronics fabrications including but not limited to semiconductor integrated circuit microelectronics fabrications, solar cell microelectronics fabrications, ceramic substrate microelectronics fabrications and flat panel display microelectronics fabrications.

Figure 1:
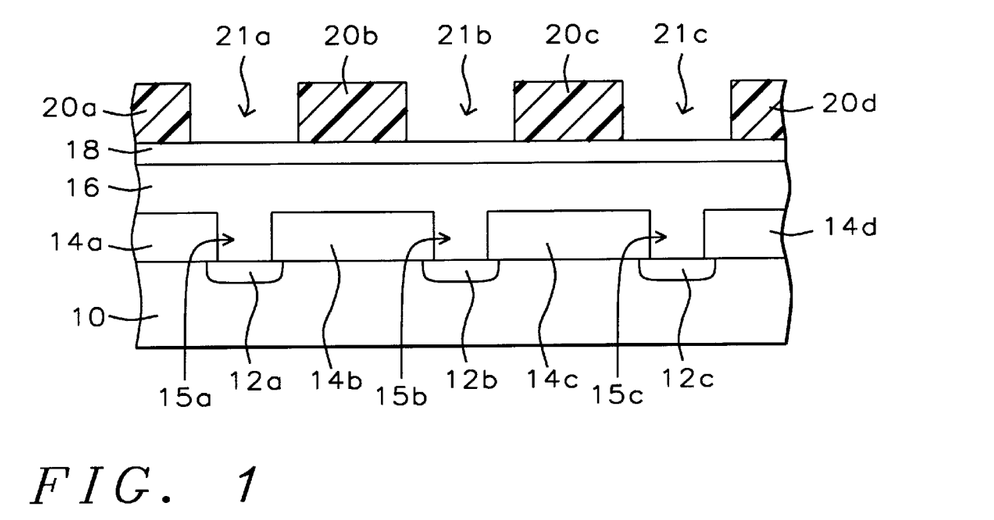
FIG. 1 to FIG. 7 show a series of schematic cross-sectional diagrams illustrating the results of forming within a microelectronics fabrication in accord with a preferred embodiment of the present invention two series of patterned low dielectric constant dielectric layers interposed between two series of patterned conductor layers in turn contacting two series of patterned conductor stud layers, in accord with the method of the present invention.

Referring now to FIG. 1 to FIG. 7, there is shown a series of schematic cross-sectional diagrams illustrating the results of forming within a microelectronics fabrication in accord with a preferred embodiment of the present invention two series of patterned low dielectric constant dielectric layers interposed between two series of patterned conductor layers which in turn contact two series of patterned conductor stud layers, formed in accord with the method of the present invention. Shown in FIG. 1 is a schematic cross-sectional diagram of the microelectronics fabrication at an early stage in its fabrication in accord with the method of the present invention.

Shown in FIG. 1 is a substrate 10 employed within a microelectronics fabrication, where the substrate 10 has formed therein a series of contact regions 12a, 12b, and 12c. Within the preferred embodiment of the present invention, the substrate 10 may be a substrate employed within a microelectronics fabrication including but not limited to a semiconductor integrated circuit microelectronics fabrication, a solar cell microelectronics fabrication, a ceramic substrate microelectronics fabrication or a flat panel display microelectronics fabrication. Although not specifically illustrated within the schematic cross-sectional diagram of FIG. 1, the substrate 10 may be the substrate itself employed within the microelectronics fabrication, or in the alternative, the substrate 10 may be the substrate employed within the microelectronics fabrication, where the substrate has any of several additional layers formed thereupon or thereover as are conventional within the microelectronics fabrication within which is employed the substrate. Such additional microelectronics layers may include, but are not limited to, microelectronics conductor layers, microelectronics semiconductor layers and microelectronics dielectric layers.

With respect to the contact regions 12a, 12b, and 12c formed within the substrate 10, the contact regions 12a, 12b, and 12c will typically be either conductor contact regions or semiconductor contact regions within the microelectronics fabrication within which is employed the substrate 10. More preferably, within the present invention when the substrate 10 is a semiconductor substrate alone employed within a semiconductor integrated circuit microelectronics fabrication, and the contact regions 12a, 12b, and 12c are semiconductor substrate contact regions which are typically employed when forming semiconductor integrated circuit devices employing the substrate 10.

Shown also within FIG. 1 formed upon the substrate 10 is a series of patterned first dielectric layers 14a, 14b, 14c, and 14d which define a series of first vias 15a, 15b, and 15c which in turn access the series of contact regions 12a, 12b, and 12c. Within the first preferred embodiment of the present invention, the series of patterned first dielectric layers 14a, 14b, 14c, and 14d is formed of a first dielectric material which is not susceptible to etching within an oxygen containing plasma. Many dielectric materials which possess this property are known in the art of microelectronics fabrication, such dielectric materials including but not limited to silicon oxide dielectric materials, silicon nitride dielectric materials, and silicon oxynitride dielectric materials which may be formed employing methods including but not limited to chemical vapor deposition (CVD) methods, plasma enhanced chemical vapor deposition (PECVD) methods and physical vapor deposition (PVD) sputtering methods. Thus, although other methods and materials may be employed, the patterned first dielectric layers 14a, 14b, 14c, and 14d are preferably formed of a silicon oxide dielectric material deposited employing a chemical vapor deposition (CVD) method, as is conventional in the art of microelectronics fabrication. Preferably, each of the patterned first dielectric layers 14a, 14b, 14c, and 14d so formed is formed to a thickness of from about 5000 to about 9000 angstroms. Preferably, each of the first vias 15a, 15b, or 15c has a linewidth of from about 0.2 to about 0.5 microns.

Also shown in FIG. 1 formed upon the patterned first dielectric layers 14a, 14b, 14c, and 14d, and portions of the contact regions 12a, 12b, and 12c exposed within the corresponding series of first vias 15a, 15b and 15c is a blanket second dielectric layer 16. Within the preferred embodiment of the present invention, the blanket second dielectric layer 16 is formed of a second dielectric material which is susceptible to etching within the oxygen containing plasma within which the patterned first dielectric layers 14a, 14b, 14c, and 14d are not susceptible to etching. For the purposes of defining an extent to which the patterned first dielectric layers 14a, 14b, 14c, and 14d are not susceptible to etching within the oxygen containing plasma while the blanket second dielectric layer 16 is susceptible to etching within the oxygen containing plasma, the blanket first dielectric layer 16 preferably has an etch rate ratio within the oxygen containing plasma with respect to the patterned first dielectric layers 14a, 14b, 14c, and 14d of greater than about 20:1, more preferably greater than about 30:1, and most preferably greater than about 50:1. Although not specifically illustrated within the schematic cross-sectional diagram of FIG. 1, the blanket second dielectric layer 16 may optionally, if desirable, be planarized employing an appropriate planarizing method.

Within the preferred embodiment of the present invention, the blanket second dielectric layer 16, which is formed of the second dielectric material which is susceptible to etching within the oxygen containing plasma is preferably formed of a low dielectric constant dielectric material selected from the group including but not limited to organic polymer spin-on-polymer dielectric materials (such as but not limited to polyimide organic polymer spin-on-polymer dielectric materials, poly-arylene-ether organic polymer spin-on-polymer dielectric materials and fluorinated poly-arylene-ether organic polymer spin-on-polymer dielectric materials) and amorphous carbon dielectric materials (such as but not limited to amorphous carbon and fluorinated amorphous carbon). Preferably, the blanket second dielectric layer 16 is formed to a thickness of from about 4000 to about 7000 angstroms.

There is also shown in FIG. 1 a blanket first hard mask layer 18 formed upon the blanket second dielectric layer 16. Within the preferred embodiment of the present invention, the blanket first hard mask layer 18 is formed of a hard mask material which is also not susceptible to etching within the oxygen containing plasma. Similarly with the patterned first dielectric layers 14a, 14b, 14c, and 14d, there are several methods and materials which may be employed in forming the blanket first hard mask layer 18, where such methods and materials include but are not limited to thermally assisted evaporation methods, electron beam assisted evaporation methods, chemical vapor deposition (CVD) methods and physical vapor deposition (PVD) sputtering methods which may be employed for forming blanket hard mask layers from hard mask materials including but not limited to conductor hard mask materials, semiconductor hard mask materials, and insulator hard mask materials. Although the blanket first hard mask layer 18 may be formed employing any of several such methods and materials as are known in the art of microelectronics fabrication, the blanket first hard mask layer 18 is typically and preferably formed of a hard mask material analogous or equivalent to the dielectric material from which is formed the patterned first dielectric layers 14a, 14b, 14c, and 14d. Preferably, the blanket first hard mask layer 18 so formed is formed to a thickness of from about 500 to about 2000 angstroms.

Finally, there is also shown in FIG. 1 the presence of a series of patterned first photoresist layers 20a, 20b, 20c, and 20d formed upon the blanket first hard mask layer 18. Within the first preferred embodiment of the present invention, the patterned first photoresist layers 20a, 20b, 20c, and 20d may be formed from any of several photoresist materials as are generally known in the art of microelectronics fabrication, including photoresist materials selected from the general groups of photoresist materials including but not limited to positive photoresist materials and negative photoresist materials. For the preferred embodiment of the present invention, the patterned first photoresist layers 20a, 20b, 20c, and 20d are preferably formed of a positive photoresist material as is conventional in the art of microelectronics fabrication, in order to assure optimal dimensional stability. Preferably, the patterned first photoresist layers 20a, 20b, 20c, and 20d so formed are formed to a thickness of from about 7000 to about 15000 angstroms.

Although not completely illustrated within the schematic cross-sectional diagram of FIG. 1, the patterned first photoresist layers 20a, 20b, 20c and 20d define a series of first trenches 21a, 21b. and 21c leaving exposed a portion of the blanket first hard mask layer 18 of areal dimension greater than the areal dimension of a corresponding first via 15a, 15b, or 15c, while simultaneously at least partially overlapping the areal dimension of the corresponding first vias 15a, 15b, or 15c. More preferably, as illustrated within the schematic cross-sectional diagram of FIG. 1, the areal dimension of each first trench 21a, 21b, or 21c within the series of first trenches 21a, 21b, and 21b completely overlaps and encompasses the areal dimension of a corresponding first via 15a, 15b, or 15c within the series of first vias 15a, 15b and 15c.

Figure 2:
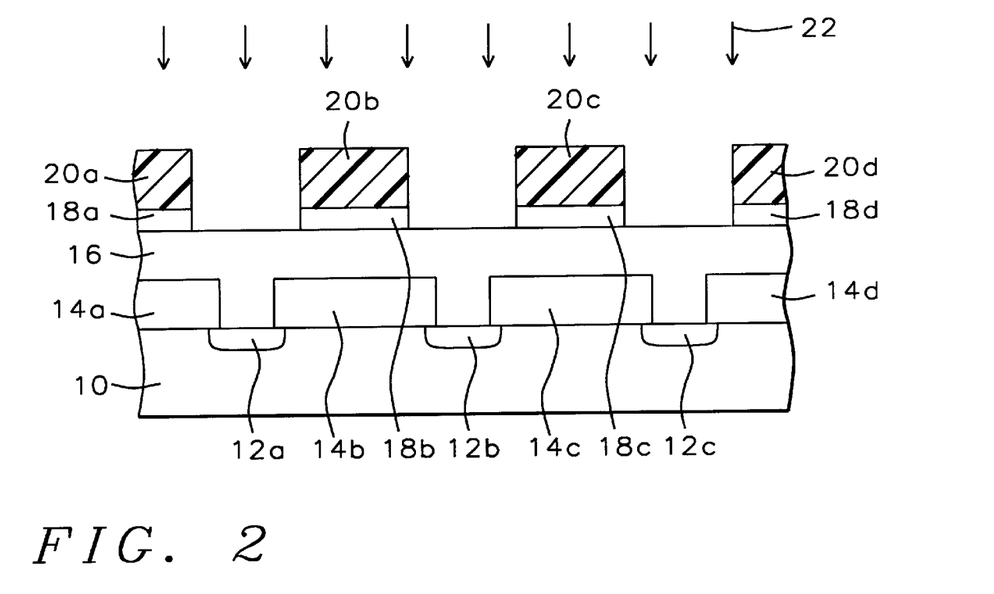

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket first hard mask layer 18 has been patterned to form a series of patterned first hard mask layers 18a, 18b, 18c, and 18d, through etching while employing a first plasma 22 in conjunction with the patterned first photoresist layers 20a, 20b, 20c, and 20d as a first photoresist etch mask layer. Within the preferred embodiment of the present invention, the first plasma 22 preferably employs an etchant gas composition appropriate to the material from which is formed the blanket first hard mask layer 18. When the blanket first hard mask layer 18 is formed from a silicon oxide dielectric material, as is preferred within the preferred embodiment of the present invention, the first plasma 22 preferably employs a fluorine containing (such as but not limited to fluorocarbon containing) etchant gas composition. Under such circumstances, the first plasma 22 more preferably employs a carbon tetrafluoride, hexafluoroethane and argon containing etchant gas composition.

Preferably, the first plasma 22 is employed within a first plasma etch method which also employs: (1) a reactor chamber pressure of from about 2 to about 8 mtorr; (2) a source radio frequency power of from about 1000 to about 2000 watts at a radio frequency of 13.56 MHZ; (3) a bias power of from about 1000 to about 2000 watts; (4) a carbon tetrafluoride flow rate of from about 10 to about 20 standard cubic centimeters per minute (sccm); (5) a hexafluoroethane flow rate of from about 10 to about 20 standard cubic centimeters per minute (sccm); and (6) an argon flow rate of from about 100 to about 300 standard cubic centimeters per minute (sccm), for a time sufficient to form from the blanket first hard mask layer 18 the corresponding series of patterned first hard mask layers 18a, 18b, 18c and 18d.

Figure 3:
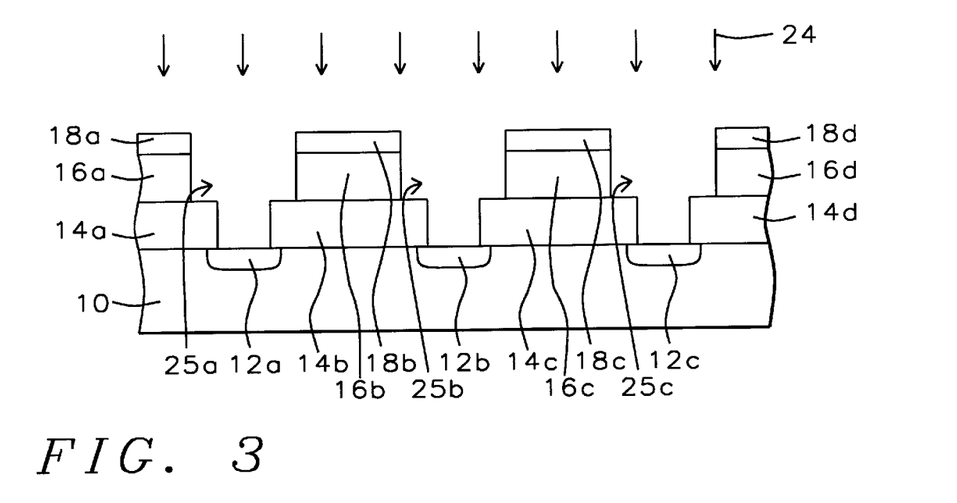

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein: (1) the patterned first photoresist layers 20a, 20b, 20c, and 20d are stripped from the microelectronics fabrication; and (2) the blanket second dielectric layer 16 is patterned to form the patterned second dielectric layers 16a, 16b, 16c, and 16d, while simultaneously forming a series of first apertures 25a, 25b, and 25c which access the corresponding contact regions 12a, 12b and 12c, while employing a second plasma 24 and at least the patterned hard mask layers 18a, 18b, 18c, and 18d as a second etch mask layer.

Within the preferred embodiment of the present invention, the second plasma 24 is the oxygen containing plasma within which neither the series of patterned first dielectric layers 14a, 14b, 14c, and 14d nor the blanket first hard mask layer 18 is susceptible to etching, but wherein the blanket second dielectric layer 16 is susceptible to etching.

Within the preferred embodiment of the present invention, the second plasma 24 preferably employs an oxygen containing etchant gas composition comprising an oxygen containing etchant gas selected from the group including but not limited to oxygen, ozone, nitrous oxide and nitric oxide. More preferably, the second plasma 24 employs an oxygen containing etchant gas comprising oxygen along with argon, where argon is employed at a sputter gas component. Preferably, the second plasma 24 is employed within a second plasma etch method which also employs: (1) a reactor chamber pressure of from about 2 to about 10 mtorr; (2) a radio frequency source power of from about 500 to about 1500 watts at a radio frequency of 13.56 MHZ; (3) a bias power of from about 1000 to about 2000 watts; (4) an oxygen flow rate of from about 10 to about 50 standard cubic centimeters per minute (sccm); (5) an argon flow rate of from about 5 to about 20 standard cubic centimeters per minute (sccm); and (6) an optional helium and/or hexafluoroethane flow rate of from about 1 to about 5 standard cubic centimeters per minute (sccm) each.

Although as illustrated within the schematic cross-sectional diagram of FIG. 3 the patterned first photoresist layers 20a, 20b, 20c, and 20d are stripped from the microelectronics fabrication whose schematic cross sectional diagram is illustrated in FIG. 2 simultaneously with patterning the blanket second dielectric layer 16 to form the patterned second dielectric layers 16a, 16b, 16c and 16d, it is also feasible within the present invention that the patterned first photoresist layers 20a, 20b, 20c, and 20d may be stripped from the patterned first hard mask layers 18a, 18b, 18c, and 18d prior to patterning the blanket second dielectric layer 16 to form the patterned second dielectric layers 16a, 16b, 16c, and 16d while employing the second plasma 24. Under such circumstances there is typically employed for stripping the patterned first photoresist layers 20a, 20b, 20c, and 20d a wet chemical photoresist stripper which does not etch the blanket second dielectric layer 16. Although such an independent stripping of the patterned first photoresist layers 20a, 20b, 20c, and 20d adds process complexity to the method of the present invention, the use of the patterned first hard mask layers 18a, 18b, 18c, and 18d alone as an etch mask layer in conjunction with the second plasma 24 will typically provide better definition of the series of first apertures 25a, 25b, and 25c which comprise: (1) a series of trenches corresponding with the series of first trenches 21a, 21b, and 21c defined by the series of patterned first photoresist layers 20a, 20b, 20c, and 20d; and (2) the series of first vias 15a, 15b, and 15c.

Under circumstances where the patterned first photoresist layers 20a, 20b, 20c, and 20d are stripped from the microelectronics fabrication whose schematic cross-sectional diagram is illustrated in FIG. 2 simultaneously with etching the blanket second dielectric layer 16 to form the patterned second dielectric layers 16a, 16b, 16c, and 16d, there is preferably employed within the preferred embodiment of the present invention a thickness of the patterned photoresist layers 20a, 20b, 20c, and 20d such that the patterned first photoresist layers 20a, 20b, 20c, and 20d are completely stripped from the corresponding patterned first hard mask layers 18a, 18b, 18c, and 18d without need for overetching the series of patterned second dielectric layers 16a, 16b, 16c, and 16d. Under such circumstances, optimal lateral dimensional integrity of the series of patterned second dielectric layers 16a, 16b, 16c, and 16d is facilitated. Similarly, the use of the argon sputtering gas component within the second plasma 24 also assists in facilitating optimal lateral dimensional integrity of the patterned second dielectric layers 16a, 16b, 16c, and 16d.

Figure 4:
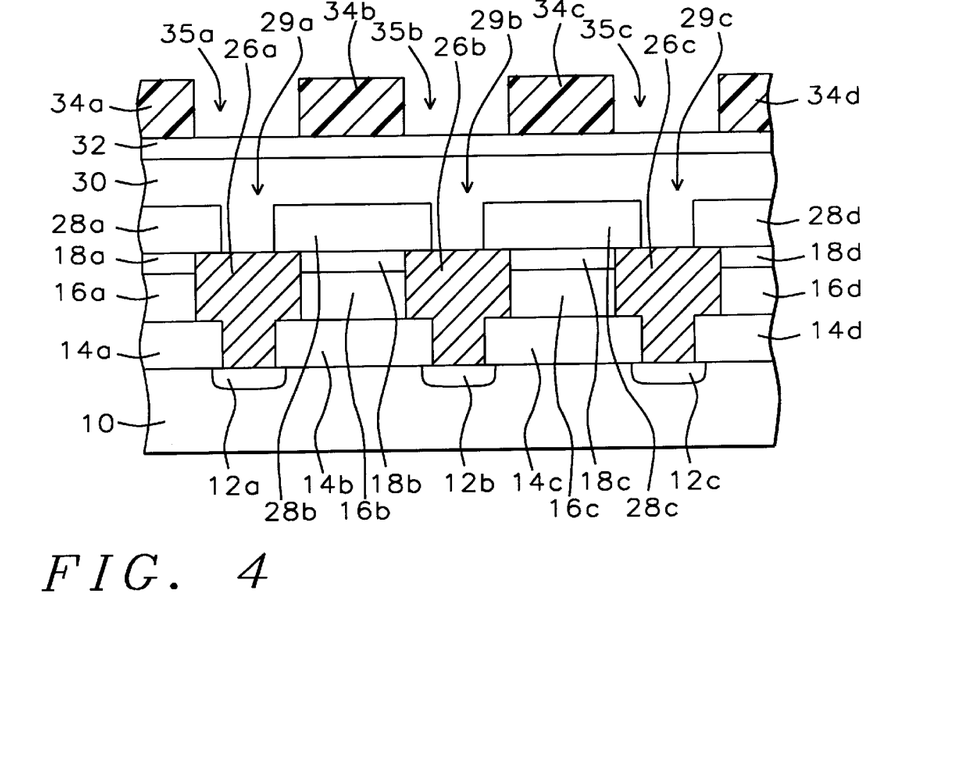

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a schematic cross-sectional diagram of a microelectronics fabrication otherwise equivalent to the microelectronics fabrication whose schematic cross-sectional diagram is illustrated in FIG. 3, but wherein there is formed into the series of first apertures 25a, 25b, and 25c a series of patterned conductive contact stud layers 26a, 26b, and 26c contacting the respective contact regions 12a, 12b, and 12c within the substrate 10. Within the preferred embodiment of the present invention, the series of patterned conductive contact stud layers 26a, 26b, and 26c is formed into the series of apertures 25a, 25b, and 25c employing a damascene method. Within the damascene method, a blanket conductive contact stud layer is formed upon the patterned hard mask layers 18a, 18b, 18c, and 18d and into the apertures 25a, 25b, and 25c, and subsequently planarized, typically employing an appropriate polishing method. For the preferred embodiment of the present invention, the patterned conductive contact stud layers 26a, 26b, and 26c may be formed of any conductive material which is conventionally employed for forming conductive contact stud layers within the microelectronics fabrication within which is employed the substrate 10. Such conductive materials may include, but are not limited to metals, metal alloys, metal composites, metal alloy composites, doped polysilicon and polycides (doped polysilicon/metal silicide stacks), beneath and/or above which may optionally be formed barrier layers, as are conventional in the art of microelectronics fabrication.

Shown also in FIG. 4 formed upon the patterned hard mask layers 18a, 18b, 18c, and 18d, and the patterned conductive stud layers 26a, 26b, and 26c, is a series of patterned third dielectric layers 28a, 28b, 28c, and 28d which define a series of second vias 29a, 29b, and 29c which access portions of the corresponding patterned conductive contact stud layers 26a, 26b, and 26c. Similarly, there is also shown in FIG. 4 formed upon the patterned third dielectric layers 28a, 28b, 28c, and 28d, and portions of the patterned conductive contact stud layers 26a, 26b, and 26c exposed within the corresponding vias 29a, 29b, and 29c a blanket fourth dielectric layer 30. In addition, there is shown in FIG. 4 formed upon the blanket fourth dielectric layer 30 a blanket second hard mask layer 32. Finally, there is shown in FIG. 4 formed upon the blanket second hard mask layer 32 a series of patterned second photoresist layers 34a, 34b, 34c, and 34d.

Within the preferred embodiment of the present invention, the series of patterned third dielectric layers 28a, 28b, 28c, and 28d is preferably formed employing methods, materials and dimensions analogous or equivalent to the methods, materials and dimensions employed in forming the series of patterned first dielectric layers 14a, 14b, 14c, and 14d as illustrated within the schematic cross-sectional diagram of FIG. 1. Similarly, within the preferred embodiment of the present invention the blanket fourth dielectric layer 30 is preferably formed employing methods, materials and dimensions analogous or equivalent to the methods, materials, and dimensions employed in forming the blanket second dielectric layer 16 as illustrated within the schematic cross-sectional diagram of FIG. 1. In addition, within the second preferred embodiment of the present invention, the blanket second hard mask layer 32 is preferably formed employing methods, materials and dimensions analogous or equivalent to the methods, materials, materials, and dimensions employed in forming the blanket first hard mask layer 18 as illustrated within the schematic cross-sectional diagram of FIG. 1. Finally, within the second preferred embodiment of the present invention, the series of second photoresist layers 34a, 34b, 34c, and 34d is preferably formed employing methods, materials and dimensions analogous or equivalent to the methods, materials and dimensions employed in forming the series of patterned first photoresist layers 20a, 20b, 20c, and 20d as illustrated within the schematic cross-sectional diagram of FIG. 1.

Figure 5:
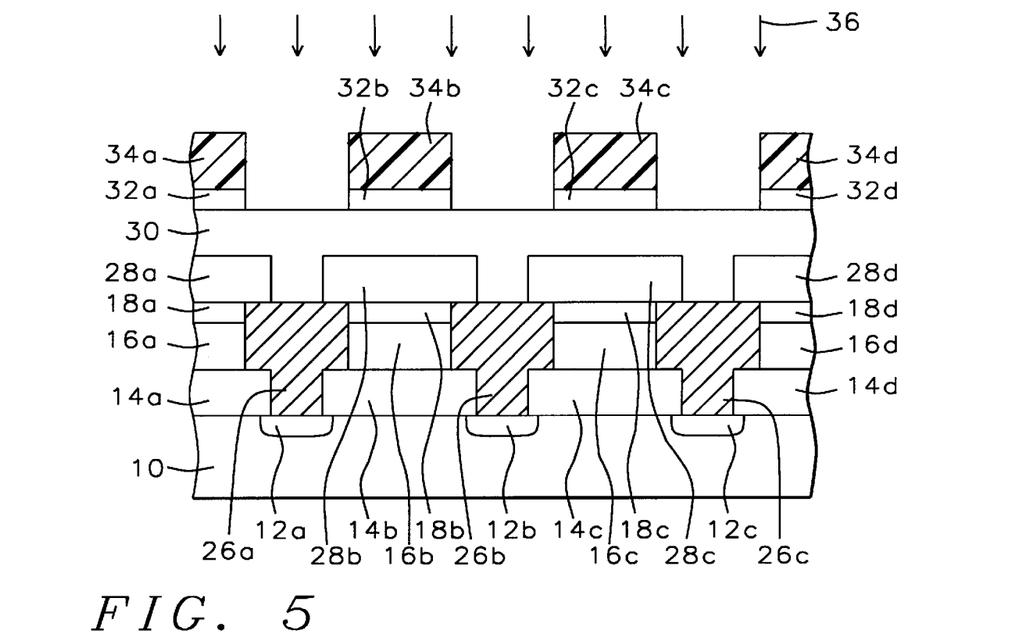

Referring now to FIG. 5, there is shown a schematic cross-sectional diagram illustrating the results of further processing of the microelectronics fabrication whose schematic cross-sectional diagram is illustrated in FIG. 4. Shown in FIG. 5 is a schematic cross-sectional diagram of a microelectronics fabrication otherwise equivalent to the microelectronics fabrication whose schematic cross-sectional diagram is illustrated in FIG. 4, but wherein the blanket second hard mask layer 32 has been patterned to form a series of patterned second hard mask layers 32a, 32b, 32c and 32d through etching with a third plasma 36 while employing the series of patterned second photoresist layers 34a, 34b, 34c, and 34d as a third etch mask layer, and while employing the blanket fourth dielectric layer 30 as an etch stop layer. Within the preferred embodiment of the present invention, the third plasma 36 is preferably formed employing methods and materials analogous or equivalent to the methods and materials employed in forming the first plasma 22 as illustrated within FIG. 2. Thus, the series of patterned second hard mask layers 32a, 32b, 32c, and 32d as illustrated in FIG. 5 is formed analogously with the series of patterned first hard mask layers 18a, 18b, 18c, and 18d as illustrated within the schematic cross-sectional diagram of FIG. 2.

Figure 6:
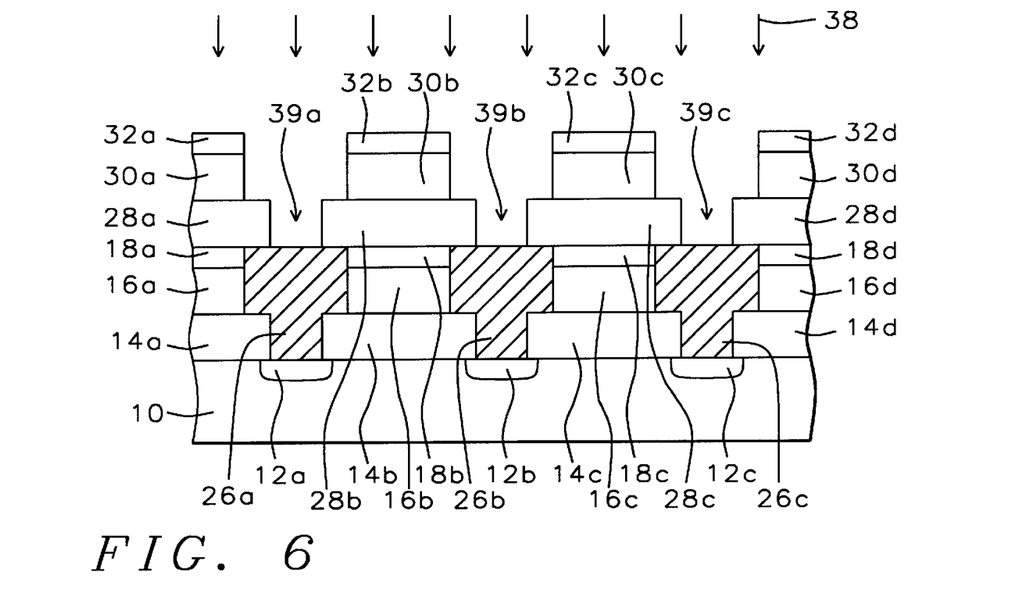

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein: (1) the series of patterned second photoresist layers 34a, 34b, 34c and 34d has been stripped from the corresponding series of patterned second hard mask layers 32a, 32b, 32c, and 32d; and (2) there is formed from the blanket fourth dielectric layer 30 a series of patterned fourth dielectric layers 30a, 30b, 30c, and 30d which defines a series of second apertures 39a, 39b and 39c which access the series of patterned conductor contact stud layers 26*a*, 26*b*, and 26*c*, while employing a fourth plasma 38 and at least the series of patterned second hard mask layers 32*a*, 32*b*, 32*c*, and 32*d* as a fourth etch mask layer. Within the preferred embodiment of the present invention, the fourth plasma 38 is preferably formed employing methods and materials analogous or equivalent to the methods and materials employed in forming the second plasma 24 as illustrated within the schematic cross-sectional diagram of FIG. 3. Thus, the series of patterned fourth dielectric layers 30*a*, 30*b*, 30*c*, and 30*d* as illustrated within the schematic cross-sectional diagram of FIG. 6 is formed analogously or equivalently with the series of patterned second dielectric layers 16*a*, 16*b*, 16*c*, and 16*d* as illustrated within the schematic cross-sectional diagram of FIG. 3.

Figure 7:
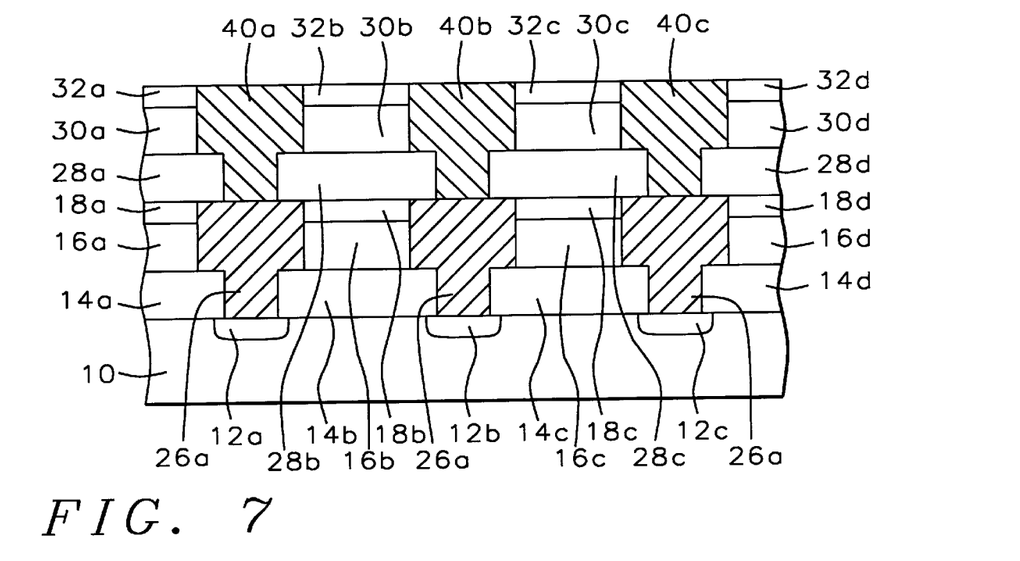

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a microelectronics fabrication otherwise equivalent to the microelectronics fabrication whose schematic cross-sectional diagram is illustrated in FIG. 6, but wherein there is formed within the series of second apertures 39*a*, 39*b*, and 39*c* a series of patterned conductive interconnection stud layers 40*a*, 40*b*, and 40*c*. Within the preferred embodiment of the present invention, the series of patterned conductive interconnection stud layers 40*a*, 40*b*, and 40*c* as illustrated within the schematic cross-sectional diagram of FIG. 7 is preferably formed employing methods, materials, and dimensions analogous or equivalent to the methods, materials, and dimensions employed in forming the patterned conductive contact stud layers 26*a*, 26*b*, and 26*c* as illustrated within the schematic cross-sectional diagram of FIG. 4.

Upon forming the microelectronics fabrication whose schematic cross-sectional diagram is illustrated in FIG. 7, there is formed a microelectronics fabrication having formed therein two series of low dielectric constant dielectric layers interposed between two series of patterned conductor layers which in turn are contiguous with and contacting two series of patterned conductor stud layers, with attenuated process complexity.

As is understood by a person skilled in the art, the preferred embodiment of the present invention is illustrative of the present invention rather than limiting of the present invention. Revisions and modifications may be made to methods, materials, structures, and dimensions through which may be formed microelectronics fabrications in accord with the preferred embodiment of the present invention while still providing microelectronics fabrications formed in accord with the method of the present invention, as defined by the appended claims.

What is claimed is:

1. A method for forming a via through a dielectric layer within a microelectronics fabrication comprising:

providing a substrate employed within a microelectronics fabrication, the substrate having a contact region formed therein;

forming upon the substrate a patterned first dielectric layer, the patterned first dielectric layer defining a via accessing the contact region, the patterned first dielectric layer being formed of a first dielectric material which is not susceptible to etching with an oxygen containing plasma;

forming upon the patterned first dielectric layer a blanket second dielectric layer, the blanket second dielectric layer completely covering the patterned first dielectric layer and filling the via, the blanket second dielectric layer being formed of a second dielectric material which is susceptible to etching within the oxygen containing plasma;

forming upon the blanket second dielectric layer a blanket hard mask layer, the blanket hard mask layer being formed from a hard mask material which is not susceptible to etching within the oxygen containing plasma;

forming upon the blanket hard mask layer a patterned photoresist layer, the patterned photoresist layer leaving exposed a portion of the blanket hard mask layer greater that an areal dimension of the via and at least partially overlapping the areal dimension of the via;

etching while employing a first plasma etch method the blanket hard mask layer to form a patterned hard mask layer defining a first trench formed through the patterned hard mask layer while employing the patterned photoresist layer as a first etch mask layer, the first plasma etch method employing a first etchant gas composition to the hard mask material from which is formed the blanket hard mask layer; and etching while employing a second plasma etch method the blanket second dielectric layer to form a patterned second dielectric layer having an aperture formed therethrough, the aperture comprising:

a second trench corresponding with the first trench; and at least a portion of the first via, the second plasma etch method employing the oxygen containing plasma.

2. The method of claim 1 wherein the microelectronics fabrication is selected from the group consisting of semiconductor integrated circuit microelectronics fabrications, solar cell microelectronics fabrications, ceramic substrate microelectronics fabrications and flat panel display microelectronics fabrications.

3. The method of claim 1 wherein the patterned first dielectric layer is formed from a dielectric material selected from the group consisting of silicon oxide dielectric materials, silicon nitride dielectric materials and silicon oxynitride dielectric materials.

4. The method of claim 1 wherein the blanket second dielectric layer is formed from a dielectric material selected from the group consisting of organic polymer spin-on-polymer dielectric materials and amorphous carbon dielectric materials.

5. The method of claim 1 wherein there is not employed a hard mask layer interposed between the patterned first dielectric layer and the blanket second dielectric layer.

6. The method of claim 1 wherein the patterned photoresist layer is stripped from the microelectronics fabrication simultaneously with etching the blanket second dielectric layer to form the aperture through the patterned second dielectric layer.

7. A method for forming a patterned conductor layer within a microelectronics fabrication comprising:

providing a substrate employed within a microelectronics fabrication, the substrate having a contact region formed therein;

forming upon the substrate a patterned first dielectric layer, the patterned first dielectric layer defining a via accessing the contact region, the patterned first dielectric layer being formed of a first dielectric material which is not susceptible to etching with an oxygen containing plasma;

forming upon the patterned first dielectric layer a blanket second dielectric layer, the blanket second dielectric layer completely covering the patterned first dielectric layer and filling the via, the blanket second dielectric layer being formed of a second dielectric material which is susceptible to etching within the oxygen containing plasma;

forming upon the blanket second dielectric layer a blanket hard mask layer, the blanket hard mask layer being formed from a hard mask material which is not susceptible to etching within the oxygen containing plasma;

forming upon the blanket hard mask layer a patterned photoresist layer, the patterned photoresist layer leaving exposed a portion of the blanket hard mask layer greater that an areal dimension of the via and at least partially overlapping the areal dimension of the via;

etching while employing a first plasma etch method, the blanket hard mask layer to form a patterned hard mask layer defining a first trench formed through the patterned hard mask layer while employing the patterned photoresist layer as a first etch mask layer, the first plasma etch method employing a first etchant gas composition to the hard mask material from which is formed the blanket hard mask layer;

etching, while employing a second plasma etch method the blanket second dielectric layer to form a patterned second dielectric layer having an aperture formed therethrough, the aperture comprising:
  a second trench corresponding with the first trench; and
  at least a portion of the first via, the second plasma etch method employing the oxygen containing plasma; and forming into the aperture a patterned conductive stud layer.

8. The method of claim 7 wherein the microelectronics fabrication is selected from the group consisting of semiconductor integrated circuit microelectronics fabrications, solar cell microelectronics fabrications, ceramic substrate microelectronics fabrications and flat panel display microelectronics fabrications.

9. The method of claim 7 wherein the patterned first dielectric layer is formed from a dielectric material selected from the group consisting of silicon oxide dielectric materials, silicon nitride dielectric materials and silicon oxynitride dielectric materials.

10. The method of claim 7 wherein the blanket second dielectric layer is formed from a dielectric material selected from the group consisting of organic polymer spin-on-polymer dielectric materials and amorphous carbon dielectric materials.

11. The method of claim 7 wherein there is not employed a hard mask layer interposed between the patterned first dielectric layer and the blanket second dielectric layer.

12. The method of claim 7 wherein the patterned photoresist layer is stripped from the microelectronics fabrication simultaneously with etching the blanket second dielectric layer to form the aperture through the patterned second dielectric layer.

13. The method of claim 7 wherein the patterned conductive stud layer is formed employing a damascene method.

* * * * *